United States Patent [19]
Matsumoto et al.

[11] Patent Number: 5,377,157
[45] Date of Patent: Dec. 27, 1994

[54] MULTIPORT MEMORY

[75] Inventors: Naoki Matsumoto, Tokyo; Tatsuo Ikawa, Kawasaki; Shigeo Oshima, Yokohama, all of Japan

[73] Assignee: Kabushiki Kaisha Toshiba, Kawasaki, Japan

[21] Appl. No.: 121,513

[22] Filed: Sep. 16, 1993

[30] Foreign Application Priority Data

Sep. 22, 1992 [JP] Japan .................. 4-252620

[51] Int. Cl.⁵ .................. G11C 7/00; G11C 8/00
[52] U.S. Cl. .................. 365/230.05; 365/189.05; 365/194; 365/221
[58] Field of Search .............. 365/189.05, 221, 230.05, 365/194, 195

[56] References Cited

U.S. PATENT DOCUMENTS

| | | | |
|---|---|---|---|
| 4,858,190 | 8/1989 | Yamaguchi et al. | 365/230.05 X |
| 5,138,581 | 8/1992 | Miyamoto et al. | 365/230.05 |
| 5,247,484 | 9/1993 | Watanabe | 365/230.05 |
| 5,249,165 | 9/1993 | Toda | 365/230.05 X |

Primary Examiner—Joseph A. Popek
Attorney, Agent, or Firm—Finnegan, Henderson, Farabow, Garrett & Dunner

[57] ABSTRACT

A multiport memory comprises a pair of memory cells, at least a pair of bit line and a pair of word lines on a random access port side. One of the memory cell is connected to one bit line and one word line and the other memory cell is connected to the other bit line and the other word line. A pair of data lines which are respectively connected to load elements are also provided in the random access port side of the multiport memory. A first switch circuit is connected between the pair of bit lines and the pair of data lines. On a serial access port side, a data register is connected between the pair of bit lines to receive data transmitted through the pair of bit lines. A second switch circuit for transmitting data is connected between the pair of bit lines and the data register. A control circuit opens the first switch circuit, before closing the second switch circuit to transmit data stored in the memory cells to the data register.

3 Claims, 3 Drawing Sheets

MULTIPORT MEMORY

BACKGROUND OF THE INVENTION

1. Field of the Invention

The present invention relates to a multiport memory having a random access port and a serial access port, in which data is transmitted from the random access port to the serial access port.

2. Description of the Related Art

FIG. 1 is a circuit diagram showing part of a general multiport memory in which data is transmitted from a random access port (RAM port) to a serial access port (SAM port). In FIG. 1, BL and $\overline{BL}$ denote a pair of bit lines and WL denotes a word line.

Memory cells, e.g., dynamic memory cells MC are provided at the intersections of the pair of bit lines BL and $\overline{BL}$ and word lines WL.

Each of the memory cells MC has a selection MOS transistor 21 and a capacitor 22. The gate of each MOS transistor 21 is connected to each word line WL and the source thereof is connected to the bit line BL or $\overline{BL}$. The capacitor 22 is connected between the drain of the MOS transistor 21 and a reference potential, e.g., a ground potential $V_{SS}$.

A sense amplifier 23 is inserted in a middle portion of the pair of bit lines BL and $\overline{BL}$. The sense amplifier 23 amplifies a minute difference between the potentials output to the bit lines BL and $\overline{BL}$ when data is read from the memory cell MC. The sense amplifier 23 is activated on the basis of a control signal SEN.

Column selection gate MOS transistors 24 and 25 are connected between the pair of bit lines BL and $\overline{BL}$ and a pair of data lines DQ and $\overline{DQ}$ for the RAM port. The gates of the transistors 24 and 25 are connected to a column selection line CSL.

Load elements 26 and 27, each consisting of a MOS transistor serving as a load transistor, are inserted between a source potential $V_{CC}$ and the pair of data lines DQ and $\overline{DQ}$. The load elements 26 and 27 are always conductive.

A data register 30 for the SAM port is connected to the pair of bit lines BL and $\overline{BL}$ through data transmission gate MOS transistors 28 and 29. The data register 30 is constituted by, for example, a flip-flop having two inverters 31 and 32. The gates of the data transmission gate MOS transistors 28 and 29 are connected to a data transmission control line TRG.

In the multiport memory as described above, when data read from a memory cell MC of the RAM port is transmitted to the SAM port, the column selection line CSL and a DQ sense amplifier (not shown) for amplifying data on the data lines DQ and $\overline{DQ}$ are inhibited from being activated, until data amplified by the sense amplifier 23 is determined, as in a normal RAM.

A conventional data reading operation of the multiport memory will be described with reference to the timing charts shown in FIGS. 2 ((A) to (G)).

A word line WL is selected in response to an address input (normally, a row address signal). A potential is read from the memory cell MC connected to the word line WL to one of the bit lines BL and $\overline{BL}$. As a result, the potential difference between the bit lines BL and $\overline{BL}$ begins to increase (FIG. 2 (A)).

Then, a signal SEN is lowered to a "L" level at a timing and the sense amplifier 23 is activated (FIG. 2 (C)).

As a result of the activation of the sense amplifier 23, the potential difference between the bit lines BL and $\overline{BL}$ is increased to be a difference between the source potential $V_{CC}$ and the ground potential $V_{SS}$. When the potential difference between the lines BL and $\overline{BL}$ becomes sufficiently great, the column selection line CSL is activated and the column selection MOS transistors 24 and 25 are turned on (FIG. 2 (D)).

Thereafter, data is transmitted from the bit lines BL and $\overline{BL}$ to the data lines DQ and $\overline{DQ}$ through the MOS transistors 24 and 25. When a predetermined period of time elapses, the data transmission control line TRG is activated and the data transmission gate MOS transistors 28 and 29 are turned on (FIG. 2 (E)).

As a result, data is transmitted from the bit lines BL and $\overline{BL}$ to the data register 30 for the SAM port.

When the data transmission gate MOS transistor 28 and 29 are in the ON state and the data is being transmitted to the data register 30 for the SAM port, the column selection MOS transistors 24 and 25 are also in the ON state.

The data lines DQ and $\overline{DQ}$ are connected to the load elements 26 and 27 constituted by the load transistors, as described above. Therefore, when the column selection line CSL is activated and the bit lines BL and $\overline{BL}$ are electrically connected to the data lines DL and $\overline{DL}$, one of the bit lines BL and $\overline{BL}$, which is set to the "L" level, is charged by the source potential $V_{CC}$ through the data lines DQ and $\overline{DQ}$.

The potential of the bit line of the "L" level increases by a potential $\Delta V$ from the ground potential $V_{SS}$, as shown in FIG. 2 (A), due to the existence of the load transistors. In this state, when the data transmission control line TRG is activated and data is transmitted from the bit lines BL and $\overline{BL}$ to the data resistor 30 for the SAM port, the high potential level of the data resistor 30 cannot be discharged since the bit line potential of the "L" level has been increased by $\Delta V$.

In a normal condition, the memory state of the data resister 30 can be inverted by using the data on the bit lines BL and $\overline{BL}$, as shown in FIG. 2 (F). However, in some cases, it cannot be converted, as shown in FIG. 2 (G), in which case, data cannot be transmitted normally. As a result, memory cell data may be damaged.

As described above, the conventional multiport memory has the drawback that an abnormal transmission may occur when data is transmitted from the RAM port to the SAM port, resulting in damage of the memory cell data of the RAM port.

SUMMARY OF THE INVENTION

The present invention has been made in consideration of the above situation, and its object is to provide a multiport memory in which data can be correctly transmitted from a RAM port to a SAM port and the memory cell data in the RAM port is prevented from being damaged.

To achieve the above object, there is provided a multiport memory comprising:
  at least a pair of bit lines;
  a pair of word lines which cross the pair of bit lines;
  a pair of memory cell means provided at intersections of the pair of bit lines and the pair of word lines, one of the memory cell means being connected to one bit line and one word line and the other memory cell means being connected to the other bit line and the other word line;

a pair of data lines for a random access port, to which load elements are respectively connected;

data register means for a serial access port, connected to the pair of bit lines, for receiving data transmitted through the pair of bit lines;

first switch circuit means connected between the pair of bit lines and the pair of data lines;

second switch circuit means connected between the pair of bit lines and the data register means; and control circuit means for opening the first switch circuit means, before closing the second switch circuit means to transmit data stored in the memory cell means to the data register means.

With the above constitution, even if load elements (e.g., load transistors) are connected to the pair of data lines for the random access port, abnormal data transmission due to the increase of the bit line potential and damage of memory cell data of the random access port can be prevented.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

An embodiment of the multiport memory of the present invention will now be described with reference to FIGS. 3 and 4.

Figure 1:
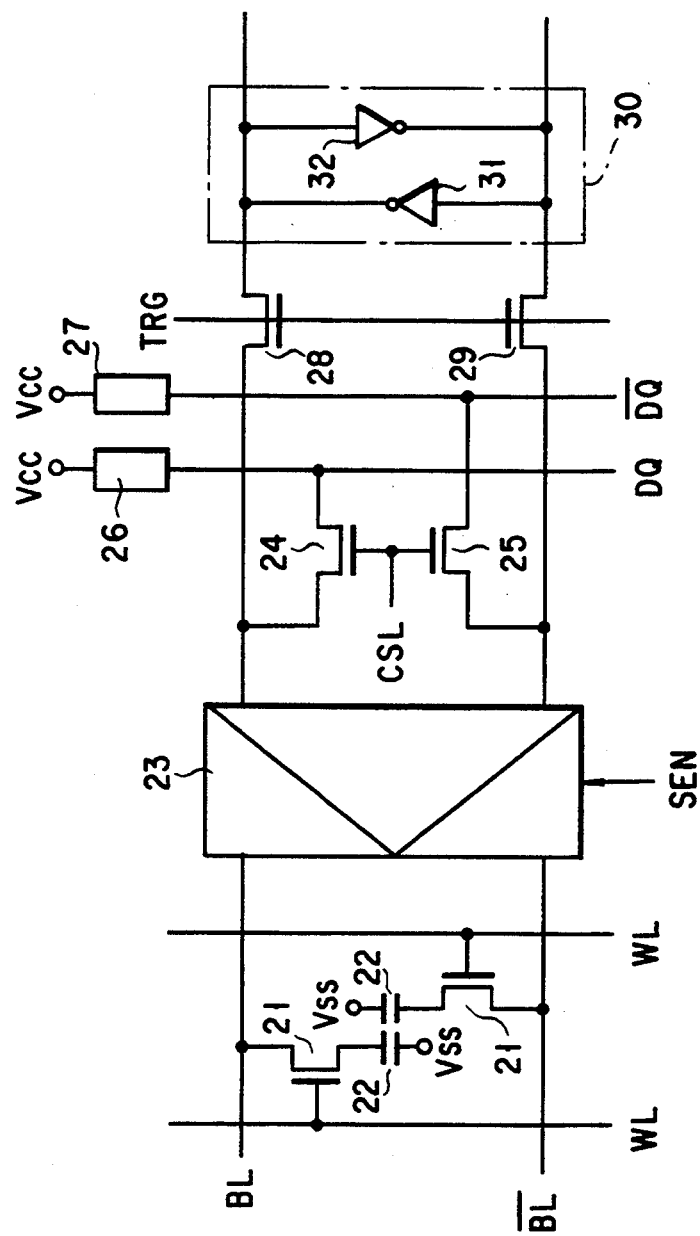
FIG. 1 is a circuit diagram showing part of a conventional multiport memory.
Figure 2:
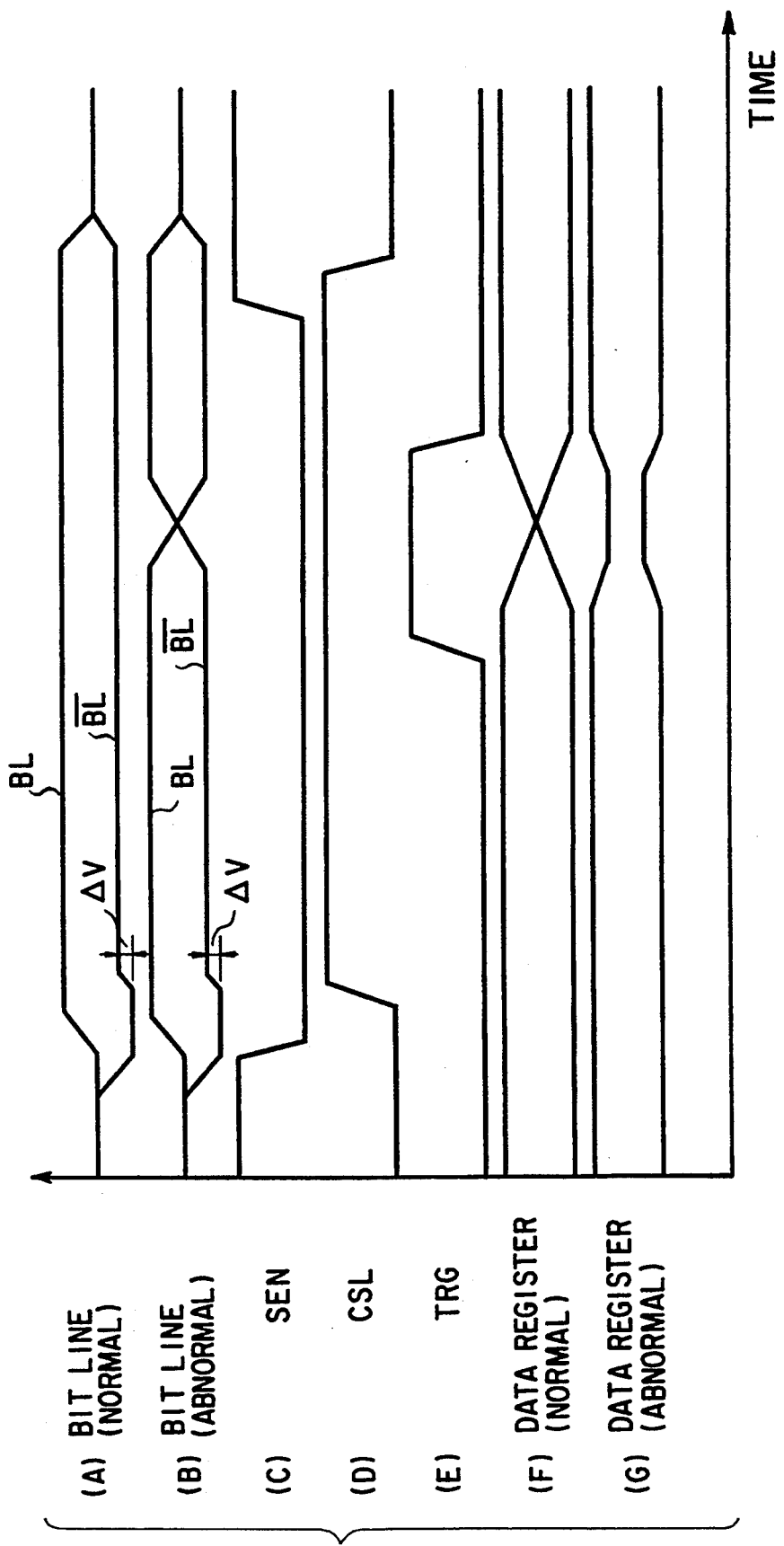
FIG. 2 is a timing chart showing an operation of the multiport memory shown in FIG. 1.

Main part of a multiport memory according to the present invention is constituted in the same manner as in the circuit shown in FIG. 1, and descriptions of the part are omitted.

Figure 3:
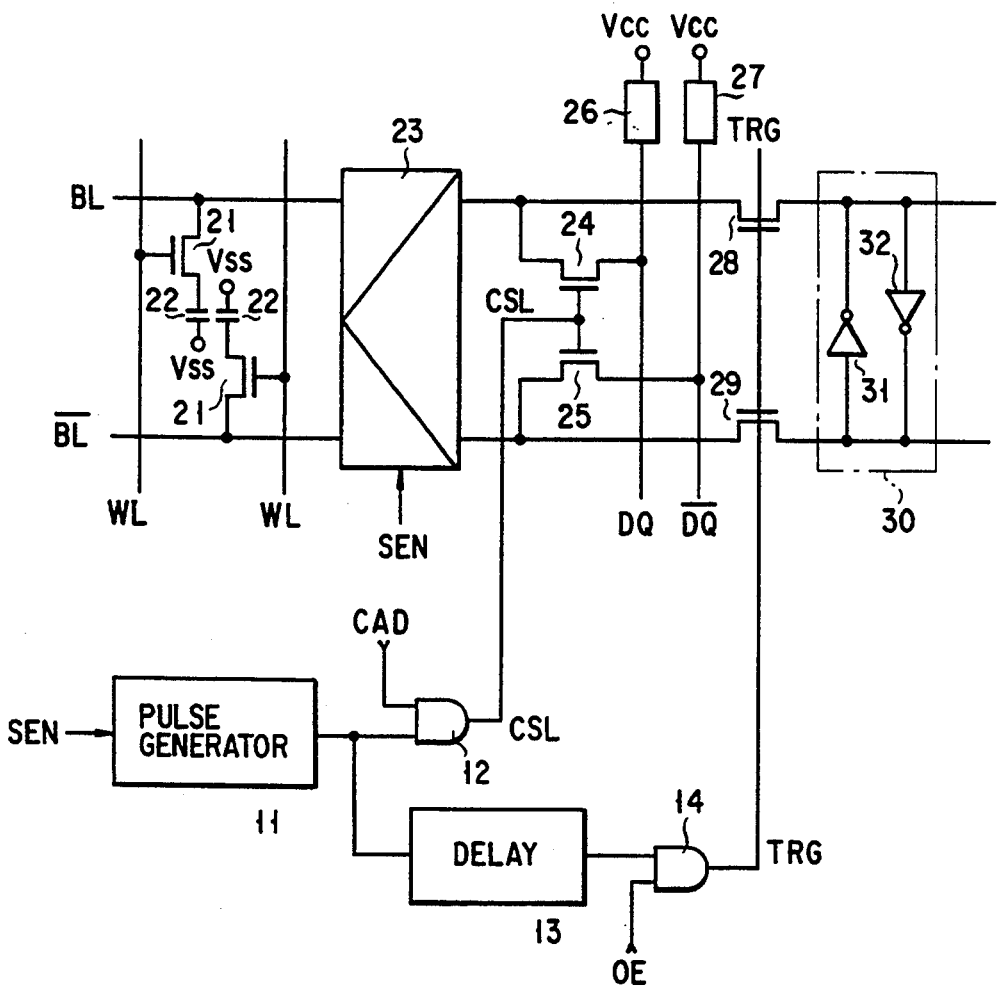
FIG. 3 is a circuit diagram showing a multiport memory according to the present invention.

As shown in FIG. 3, in the multiport memory of the present invention, a pulse signal generator 11 is connected to a column selection line CSL and a data transmission control line TRG to generate a pulse signal for controlling activation of these lines. The pulse generator 11 generates a pulse signal in synchronism with the trailing edge of a control signal SEN used to activate the sense amplifier 23 as shown in FIG. 1.

The pulse signal generated by the pulse generator 11 is supplied to one input terminal of a two-input AND gate 12 and a delay 13. A control signal CAD, which is changed to an "H" level after a column address to be supplied to the multiport memory is determined, is supplied to the other input terminal of the AND gate 12. An output of the delay 13 is input to one input terminal of a two-input AND gate 14. A control signal OE, which is changed to an "H" level when memory cell data is output from the memory, is supplied to the other input terminal of the AND gate 14. Outputs of the AND gates 12 and 14 are respectively output to the column selection line CSL and the data transmission control line TRG.

Data reading operation of the above circuit will now be described with reference to timing charts shown in FIGS. 4 ((A) to (E)).

A word line WL is selected in response to an address input (normally, a row address signal). A potential is read from the memory cell MC connected to the word line WL to one of the bit lines BL and $\overline{BL}$. Thereafter, the potential difference between the bit lines BL and BL begins to increase (FIG. 4 (A)).

Figure 4:
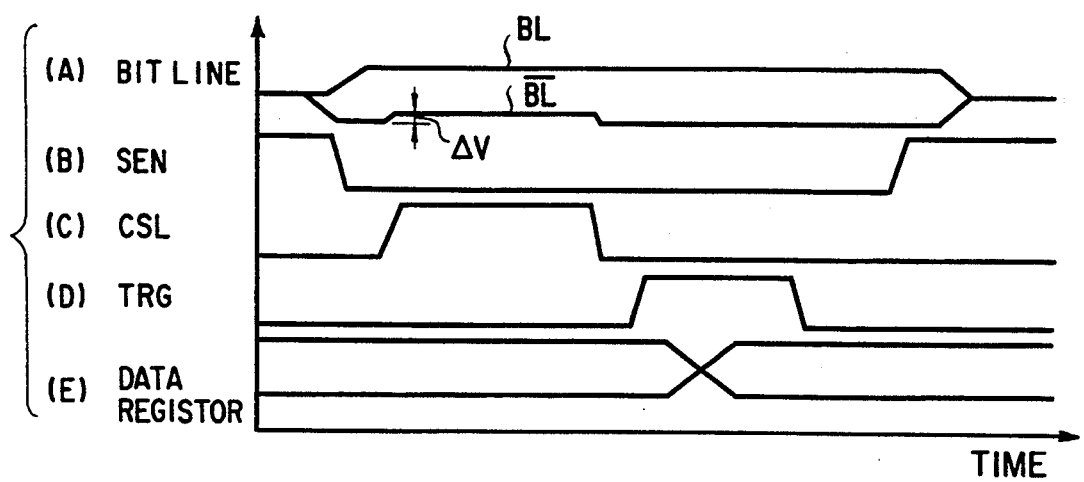
FIG. 4 is a timing chart showing an operation of the multiport memory of the present invention which operates under control of the control circuit shown in FIG. 3.

Then, a signal SEN is lowered to a "L" level at a timing and the sense amplifier 23 shown in FIG. 3 is activated (FIG. 4 (B)).

As a result of the activation of the sense amplifier 23, the potential difference between the bit lines BL and $\overline{BL}$ is increased to be a difference between the source potential $V_{CC}$ and the ground potential $V_{SS}$. The pulse generator 11 shown in FIG. 3 detects that the level of the signal SEN is lowered to the "L" level, and outputs a pulse signal of a predetermined pulse width.

When the potential difference between the lines BL and $\overline{BL}$ becomes sufficiently great, the column address is determined and the control signal CAD becomes "H" level. As a result, the output of the AND gate 12 rises to "H" level and a column selection line CSL is activated (FIG. 4 (C)).

Then, column selection MOS transistors 24 and 25 are turned on and data is transmitted from the bit lines BL and $\overline{BL}$ to the data lines DQ and $\overline{DQ}$.

When the column selection MOS transistors 24 and 25 are turned on, the potential of one of the bit lines BL and $\overline{BL}$ which is set to the "L" level is increases by a potential $\Delta V$ from the ground potential $V_{SS}$ (FIG. 4 (A)).

When a predetermined period of time elapses and the output of the pulse generator 11 is lowered to the "L" level, the output of the AND gate 12 is also lowered to the "L" level and the column selection line CSL is inactivated (FIG. 4 (C)).

As a result, the bit lines BL and $\overline{BL}$ are electrically disconnected from the data lines DL and $\overline{DL}$.

After the column selection line CSL is inactivated, the delay 13 outputs a pulse signal which is a predetermined period of time delayed. At this time, if the control signal OE is set to the "H" level, the pulse signal is directly output from the AND gate 14 to the data transmission control line TRG, thereby activating the line TRG (FIG. 4 (D)).

As a result, data transfer gate MOS transistors 28 and 29 are turned on, and data is transmitted from the bit lines BL and $\overline{BL}$ to the data register 30 for the SAM port.

During this data transmission, since the column selection line CSL has been inactivated in advance, the bit lines BL and $\overline{BL}$ are electrically disconnected from the data lines DL and $\overline{DL}$. In this state, since the data lines DL and $\overline{DL}$ are not charged by the source potential $V_{CC}$ through the bit lines BL and $\overline{BL}$, load elements 26 and 27 constituted by load transistors are not connected to the data lines DQ and $\overline{DQ}$, and the one of the bit lines BL and e,ovs/BL/ set to the "L" level is maintained at the original ground potential $V_{SS}$.

Therefore, when the data is transmitted from the bit lines BL and $\overline{BL}$ to the data register 30 for the SAM port, the high potential level of the data register 30 can be sufficiently discharged by the "L" level bit line potential. Thus, it is ensured that the memory state of the data register 30 is inverted by the data on the bit lines BL and $\overline{BL}$. As a result, the data transmission can be performed accurately, while memory cell data is not damaged.

The present invention is not limited to the above embodiment but can be variously modified. In the above embodiment, activation or inactivation of the column selection line CSL and the data transmission control line TRG is controlled by the control circuit as shown in FIG. 3. However, this control can be performed by any type of control signal, as long as the column selection line SCL is inactivated before the data transmission control line TRG is activated. Moreover, the configuration of the control circuit is not necessarily as shown in FIG. 3.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multiport memory comprising:
   at least a pair of bit lines;
   a pair of word lines which cross the pair of bit lines;
   a pair of memory cell means provided at intersections of the pair of bit lines and the pair of word lines, one of the memory cell means being connected to one bit line and one word line and the other memory cell means being connected to the other bit line and the other word line;
   a pair of data lines for a random access port, to which load elements are respectively connected;
   data register means for a serial access port, connected to the pair of bit lines, for receiving data transmitted through the pair of bit lines;
   first switch circuit means connected between the pair of bit lines and the pair of data lines;
   second switch circuit means connected between the pair of bit lines and the data register means; and
   control circuit means for opening the first switch circuit means, before closing the second switch circuit means to transmit data stored in the memory cell means to the data register means,
   the control circuit means comprising pulse signal generating circuit means for generating a pulse signal to a column selection line connected to the first switch circuit means and a data transmission control line connected to said second switch circuit means to activate them, and delay circuit means for delaying the timing of supplying a pulse signal from the pulse generating means to the data transmission control line later than the timing of supplying a pulse signal to the column selection line.

2. The multiport memory according to claim 1, wherein the first switch circuit means include a pair of MOS transistors, one of which is connected to one of the pair of bit lines and one of the pair of data lines and the other of which is connected to the other bit line and the other data line, and the gates of the MOS transistors are connected in common to a column selection line.

3. The multiport memory according to claim 1, wherein the second switch circuit means include a pair of MOS transistors, one of which is connected between one of the pair of bit lines and the data register means and the other of which is connected between the other bit line and the data register means, and the gates of the MOS transistors are connected in common to a data transmission control line.

* * * * *